United States Patent
Bunin et al.

(10) Patent No.: US 11,978,792 B2
(45) Date of Patent: May 7, 2024

(54) MULTICHANNEL TRANSISTOR

(71) Applicant: VISIC TECHNOLOGIES LTD., Rehovot (IL)

(72) Inventors: Gregory Bunin, Ashdod (IL); Tamara Baksht, Tel Aviv (IL)

(73) Assignee: VISIC TECHNOLOGIES LTD., Rehovot (IL)

( * ) Notice: Subject to any disclaimer, the term of this patent is extended or adjusted under 35 U.S.C. 154(b) by 2058 days.

(21) Appl. No.: 14/761,010

(22) PCT Filed: Jan. 15, 2014

(86) PCT No.: PCT/IB2014/058300
§ 371 (c)(1),
(2) Date: Jul. 15, 2015

(87) PCT Pub. No.: WO2014/111864
PCT Pub. Date: Jul. 24, 2014

(65) Prior Publication Data
US 2015/0372126 A1    Dec. 24, 2015

Related U.S. Application Data

(60) Provisional application No. 61/752,647, filed on Jan. 15, 2013.

(51) Int. Cl.
| | | |
|---|---|---|
| *H01L 29/778* | (2006.01) | |
| *H01L 23/535* | (2006.01) | |
| *H01L 29/417* | (2006.01) | |
| *H01L 29/20* | (2006.01) | |
| *H01L 29/423* | (2006.01) | |

(52) U.S. Cl.
CPC ........ *H01L 29/7788* (2013.01); *H01L 23/535* (2013.01); *H01L 29/417* (2013.01); *H01L 29/7783* (2013.01); *H01L 29/7786* (2013.01); *H01L 29/2003* (2013.01); *H01L 29/41766* (2013.01); *H01L 29/4236* (2013.01); *H01L 2924/0002* (2013.01)

(58) Field of Classification Search
CPC ............. H01L 29/7782; H01L 29/7783; H01L 29/7785
See application file for complete search history.

(56) References Cited

U.S. PATENT DOCUMENTS

| | | | |
|---|---|---|---|
| 2009/0267078 A1* | 10/2009 | Mishra | H01L 29/2003 257/76 |
| 2010/0140660 A1* | 6/2010 | Wu | H01L 29/2003 257/183 |
| 2011/0215378 A1 | 9/2011 | Hwang et al. | |
| (Continued) | | | |

FOREIGN PATENT DOCUMENTS

CN         202917497         5/2013

OTHER PUBLICATIONS

International Search Report dated Mar. 25, 2014 for corresponding PCT/IB2014/058300, Filing date Jan. 15, 2014.

*Primary Examiner* — Christopher A Johnson
(74) *Attorney, Agent, or Firm* — PEARL COHEN ZEDEK LATZER BARATZ LLP

(57) ABSTRACT

A field effect transistor (FET) includes a plurality of substantially parallel conductive channels and at least one electrically conducting plug to travers and form an ohmic connection with at least two of the plurality of conductive channels.

18 Claims, 5 Drawing Sheets

(56) References Cited

U.S. PATENT DOCUMENTS

| | | | |
|---|---|---|---|
| 2011/0297961 A1* | 12/2011 | Bunin | H01L 29/42316 257/E29.091 |
| 2012/0153300 A1* | 6/2012 | Lidow | H01L 21/743 257/77 |
| 2013/0334573 A1* | 12/2013 | Ostermaier | H01L 29/4236 257/194 |

* cited by examiner

MULTICHANNEL TRANSISTOR

RELATED APPLICATIONS

The present application is a U.S. National Phase of PCT/IB2014/058300 filed on Jan. 15, 2014, which claims benefit under 35 U.S.C 119(e) from U.S. Provisional application 61/752,647 filed Jan. 15, 2013. The contents and disclosures of these prior applications are incorporated herein by reference in their entirety.

TECHNICAL FIELD

Embodiments of the invention relate to field effect transistors.

BACKGROUND

Many different products and systems, including, radar systems, electric motor controllers, uninterrupted power supply (UPS) systems, and consumer products such as air conditioners, washing machines and electric powered vehicles, require relatively large amounts of electric power, typically provided by a high voltage power supply. Various types of semiconductor field effect transistors (FETs) are generally used as power switches in semiconductor circuits that provide switching functions required by the circuits to connect the power supply to the products and systems.

A FET typically comprises terminals referred to as a "source" and a "drain" for connecting a power source to a load, as well as a terminal located between the source and drain referred to as a "gate" for controlling resistance of a current carrying "channel" (or alternatively a "conductive channel") in the FET located under the gate between the source and drain. Voltage relative to a common ground applied to the gate generates an electric field in the FET that controls the resistance of the channel to turn the transistor ON and OFF. When turned ON, resistance of the channel is reduced, which allows a relatively large "ON current" to flow between the source and drain. Total resistance between the source and drain when the transistor is turned ON is referred to as an "ON resistance", or "$R_{DS(ON)}$", of the transistor. The $R_{DS(ON)}$ depends upon the resistance of the channel, resistance to current flow of a region of the FET under, and in the neighborhood, of the source, and resistance of a region of the FET under, and in the neighborhood, of the drain. The regions under and in the neighborhoods of the source and drain are conventionally referred to as a "source access region" and a "drain access region", respectively.

The FET switches are advantageously characterized by relatively high breakdown voltages when they are OFF, high ON currents between source and drain when they are ON, and relatively low gate and drain leakage currents.

For example, it may be advantageous for a FET power switch used in an electric vehicle, UPS, or photovoltaic inverter to have a breakdown voltage equal to or greater than about 600 V (Volts) and drain leakage currents less than about 100 µA per mm (microamperes per millimeter) of gate periphery when OFF. When ON, it is advantageous that the switch has a relatively small ON resistance that is less than or equal to about 10 Ohm per mm of the gate periphery and be capable of safely supporting a drain current greater than or equal to about 50 A (amperes).

Nitride based semiconductor materials, such as GaN (Gallium Nitride) and AlN (Aluminum Nitride) are characterized by relatively large band gaps of 3.4 eV (electron volts) and 6.2 eV respectively. The large band gaps of the materials are advantageous for providing semiconductor devices with relatively large breakdown voltages and low reverse bias currents. The materials have been used to produce high power, planar power FETs that exhibit fast switching times, relatively large breakdown voltages, and support large source-to-drain currents.

FETs having a nitride semiconductor layer structure comprising a narrow band gap "channel" layer adjacent a wide band gap "electron supply" layer generate a relatively high concentration of electrons, supplied from the electron supply layer, which accumulate in a narrow triangular potential well located at the channel layer near its interface with the electron supply layer. The accumulated electrons form a relatively thin, sheet-like concentration of high mobility electrons characterized by a high saturation drift velocity, which is referred to as two dimensional electron gas (2DEG). Because of the geometrical construction and location of the 2DEG, electrons in the 2DEG generally evidence very low donor impurity scattering, and as a result, the relatively high electron mobility, which may for example be equal to about $1.5 \times 10^7$ cm/s (centimeters per second). Concentrations of electrons in a 2DEG may be as high as $1 \times 10^{13}/cm^2$.

For convenience of presentation, the portion of the channel layer where the 2DEG forms may be referred to herein as the "2DEG current channel".

FET transistors that operate by generating and controlling high mobility electrons in 2DEGs to serve as the ON current are conventionally referred to as high electron mobility transistors or "HEMTs". Semiconductor layer structures comprising contiguous layers of different composition that characterize these transistors are referred to as "heterostructures", and interfaces between two contiguous layers of different composition are referred to as "heterojunctions". As such, HEMTs may alternatively be referred to as "heterostructure FETs" ("HFETs").

HEMTs may be normally ON or normally OFF. In a normally OFF HEMT, the channel and electron supply layers may be associated with a third nitride layer, referred to as a "potential modifying layer". An electric field generated by piezoelectric and/or spontaneous polarization of the potential modifying layer has a direction opposite to that in the electron supply layer. The electric field of the potential modifying layer modifies an electrostatic potential generated by electrostatic fields resulting from polarization of the channel and electron supply layers to substantially depopulate the 2DEG channel in the associated channel layer of electrons so that the FET is normally OFF.

HEMTs may comprise a plurality of 2DEG current channels. Generating additional 2DEGs enable establishment of a relatively small resistance channel when the HEMT is ON and thus enable the establishment of a relatively small $R_{DS(ON)}$ for the HEMT. For convenience of presentation, an HEMT having multiple 2DEG current channels may be referred to herein as a "multichannel HEMT".

Whereas nitride-based multichannel HEMTs are well-suited for power semiconductor switches, there is a need for multichannel HEMTs with yet more favorable functional parameters, such as having even smaller $R_{DS(ON)}$.

SUMMARY

An aspect of an embodiment of the invention relates to providing an improved FET having a relatively small $R_{DS(ON)}$.

In accordance with an embodiment of the invention, a multichannel FET having a plurality of conductive channels separated by potential barriers includes at least one electrically conducting plug ("plug") that traverses, and forms ohmic contacts with, at least two of the plurality of conductive channels. In certain embodiments of the invention, the plug traverses, and forms ohmic contacts with, all of the plurality of conductive channels.

According to an embodiment of the invention, the multichannel FET is a multichannel HEMT having a heterostructure, wherein at least one of the plurality of conductive channels is a 2DEG current channel.

According to an embodiment of the invention, the plug is a metal plug.

In accordance with an embodiment of the invention, the plurality of conductive channels electrically coupled by the at least one plug comprises a first conductive channel having a region of disrupted channel conductivity and a second non-disrupted conductive channel. In accordance with an embodiment of the invention, the at least one plug may electrically couple a non-disrupted portion of the first disrupted conductive channel to the second non-disrupted conductive channel to enhance the capacity of the first disrupted conductive channel to carry ON current.

In certain embodiments of the invention, the region of disrupted channel conductivity may be created by a trench that optionally transects a portion of the first current channel. In certain embodiments of the invention, a gate is situated in the trench. In certain embodiments of the invention, the region of disrupted channel conductivity comprises a potential barrier created, for example, by a negative-biased Schottky contact in the vicinity of the conductive channel.

In certain embodiments of the invention, the multichannel HEMT may comprise at least one plug between the source and the region of disrupted channel conductivity and/or at least one plug between the drain and the region of disrupted channel conductivity.

In accordance with an embodiment of the invention, the at least one plug may comprise an array of plugs. The plugs of the plug array may optionally be evenly spaced with each other. In certain embodiments of the invention, the plug array may comprise a row of evenly spaced plugs situated substantially equidistant from a region of disrupted channel conductivity, for example, a side of the trench.

According to an embodiment of the invention, the heterostructure may comprise semiconductor layers having InP (Indium Phosphide), AlGaAs (Aluminum Gallium Arsenide), Si (Silicon), SiGe (Silicon Germanium), and/or InGaAs (Indium Gallium Arsenide). According to an embodiment of the invention, the heterostructure comprises nitride semiconductor layers. In certain embodiments of the invention, the channel and electron supply layers associated with the 2DEG current channels are formed, respectively, from GaN and $In_yAl_zGa_{1-y-z}N$ where $0 \leq y < 1$, $0 < z < 1$.

In the discussion, unless otherwise stated, adjectives, such as "substantially" and "about", modifying a condition or relationship characteristic of a feature or features of an embodiment of the invention, are understood to mean that the condition or characteristic is defined to within tolerances that are acceptable for operation of the embodiment for an application for which it is intended. Unless otherwise indicated, the word "or" in the specification and claims is considered to be the inclusive "or" rather than the exclusive or, and indicates at least one of, or any combination of items it conjoins.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF FIGURES

Non-limiting examples of embodiments of the invention are described below with reference to figures attached hereto that are listed following this paragraph. Identical structures, elements or parts that appear in more than one figure are generally labeled with a same numeral in all the figures in which they appear. Dimensions of components and features shown in the figures are chosen for convenience and clarity of presentation and are not necessarily shown to scale.

DETAILED DESCRIPTION

Figures 1A, 1B:
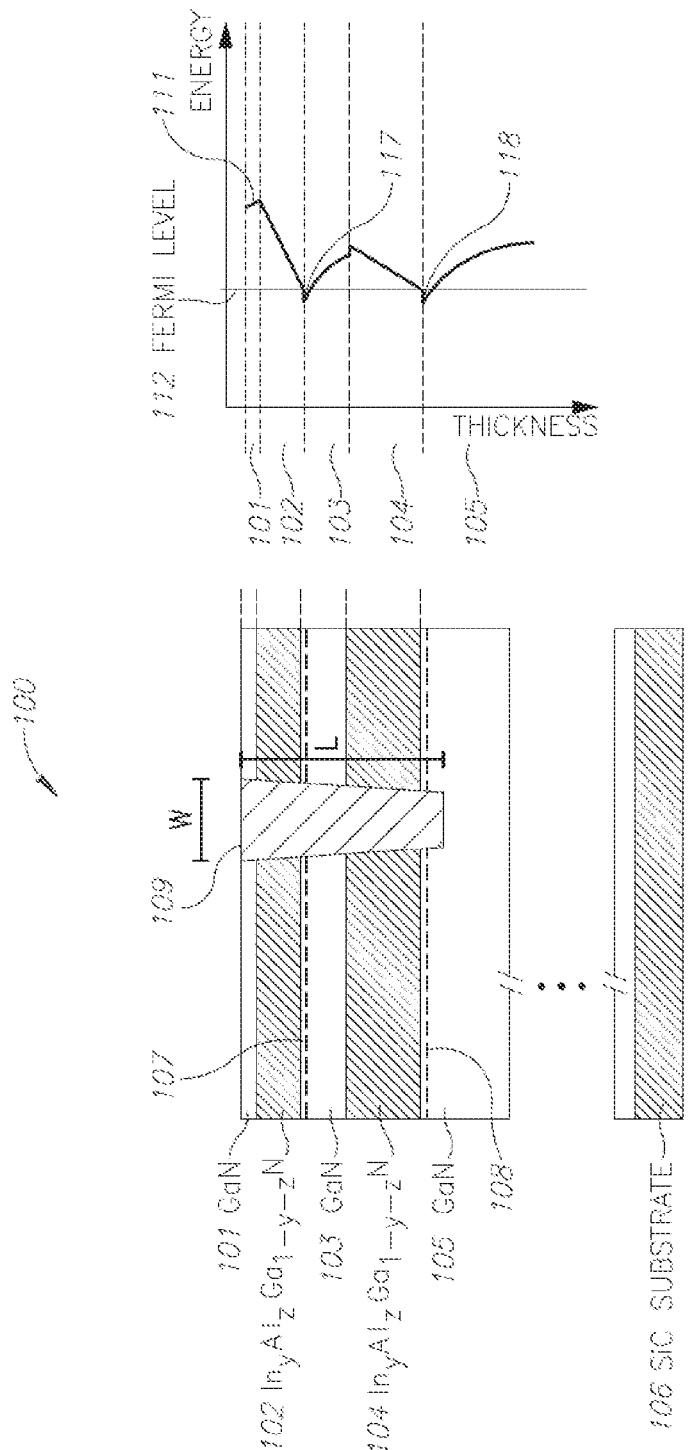
FIGS. 1A and 1B schematically show a cross section view and related energy band diagram respectively of a heterostructure of a multichannel HEMT comprising a plug, in accordance with an embodiment of the invention.
Figure 1C:
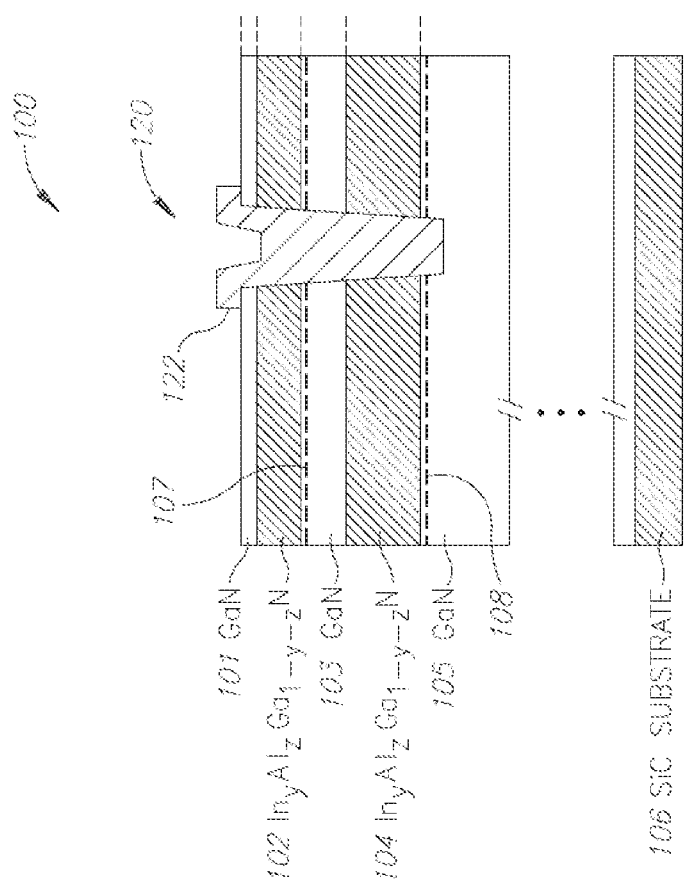
FIG. 1C schematically shows a cross section view of the heterostructure of FIG. 1A comprising an alternative plug in accordance with an embodiment of the invention.
Figure 2A:
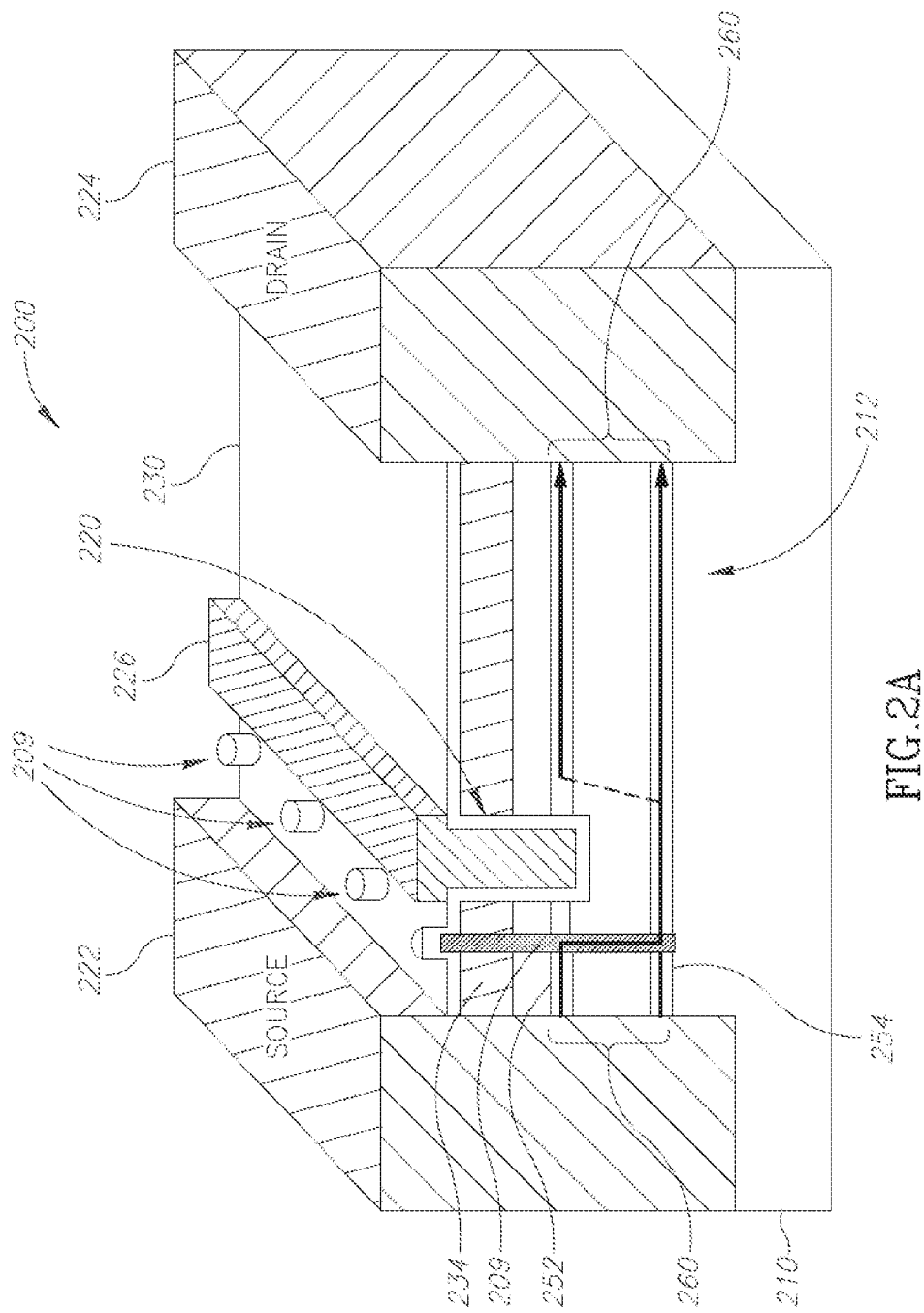
FIG. 2A shows a schematic illustration of the multichannel HEMT with a row of plugs between a source and a trench having a gate, in accordance with an embodiment of the invention.
Figure 2B:
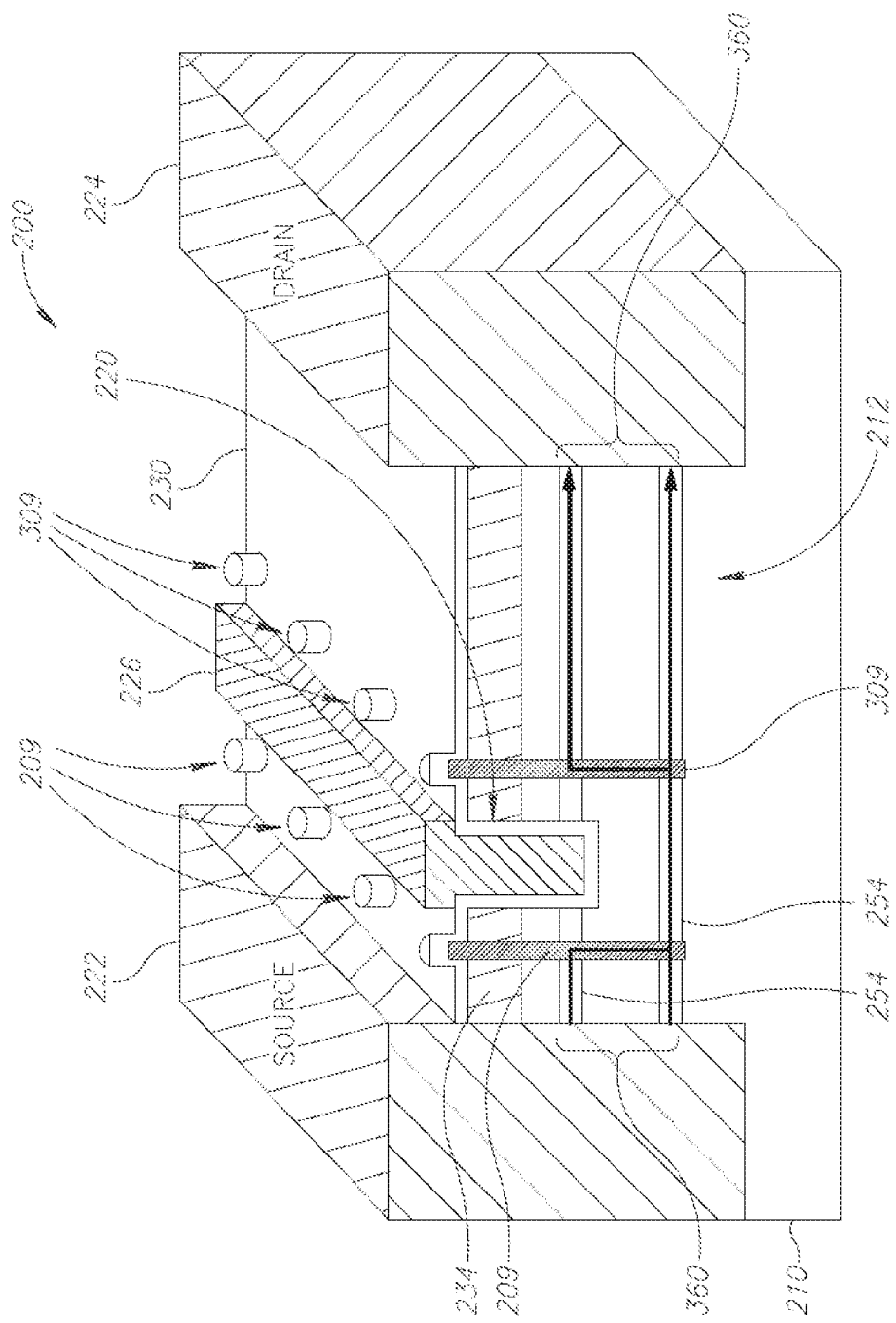
FIG. 2B shows a schematic illustration of the multichannel HEMT with a first row of plugs between the source and the trench, as well as a second row of plugs between the drain and the trench, in accordance with an embodiment of the invention.
Figure 3:
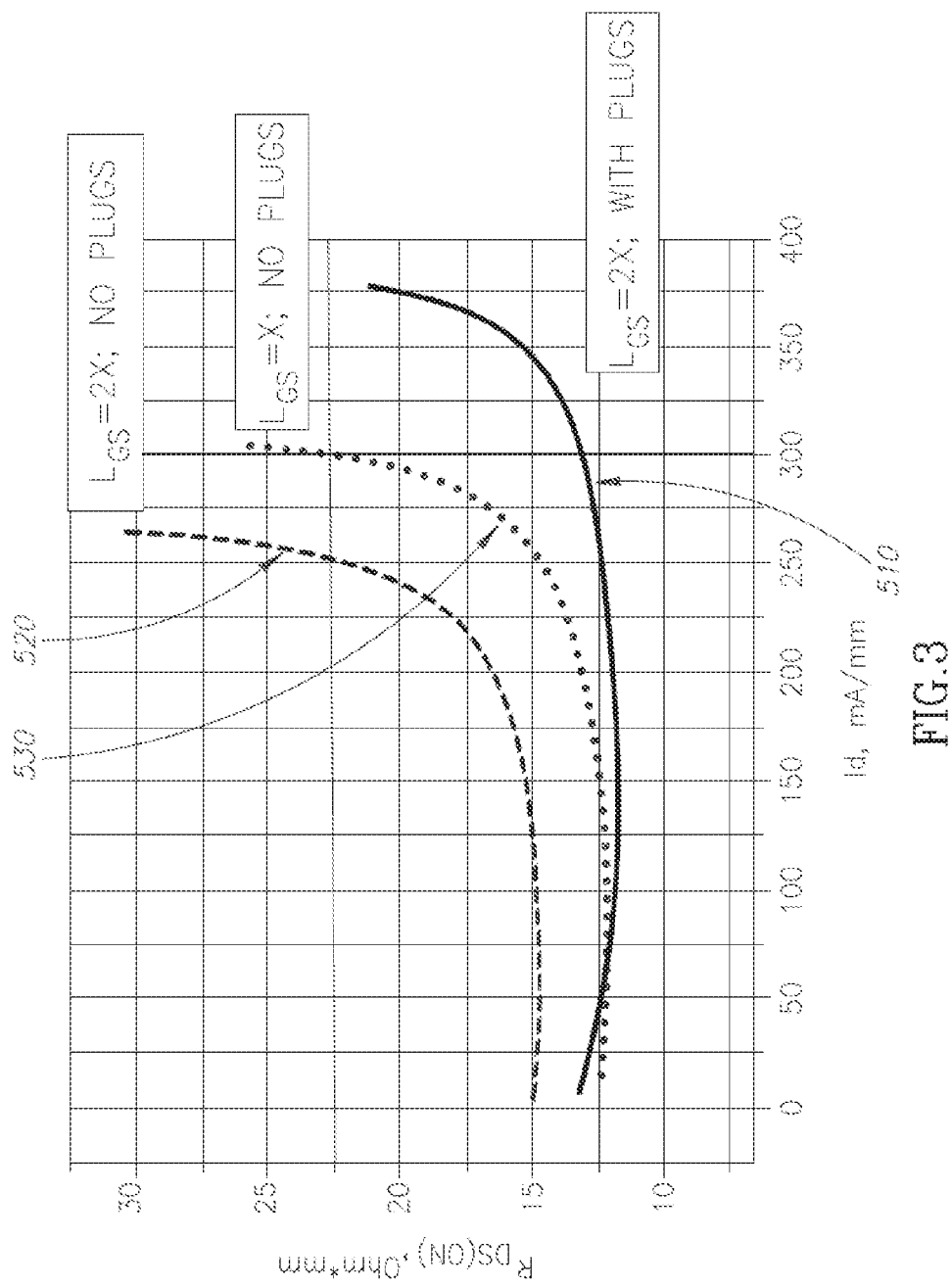
FIG. 3 shows a graph with plots showing $R_{DS(ON)}$ as a function of drain current (Id), as measured from multichannel HEMTs with and without plugs.

In the following Detailed Description, an multichannel HEMT heterostructure having electrically conductive plugs in accordance with an embodiment of the invention is schematically illustrated in FIGS. 1A-1C and discussed with reference to those figures. Exemplary multichannel HEMTs with rows of plugs on one or both sides of a trench formed in the heterostructure are schematically illustrated in FIGS. 2A-2B and discussed with reference to those figures. A graph with lines showing $R_{DS(ON)}$ as a function of drain current (Id), as measured from multichannel HEMTs with plugs in accordance with an embodiment of the invention, is shown in FIG. 3 and discussed with reference to that figure.

FIG. 1A schematically shows a cross section view of an example of a GaN-based heterostructure 100 of a multichannel HEMT having multiple 2DEG current channels, schematically represented by dashed lines 107 and 108, for conducting ON current between a source (not shown) and a drain (not shown). In accordance with an embodiment of the invention, heterostructure 100 comprises at least one plug 109 that traverses and electrically couples top 2DEG current channel 107 with bottom 2DEG current channel 108.

Heterostructure 100 comprises a bottom substrate layer 106 on which overlaying layers are epitaxially formed, optionally by a metal organic chemical vapor deposition (MOCVD) growth process or a molecular beam epitaxy (MBE) growth process. Substrate layer 106 may comprise Si, $Al_2O_3$ (Sapphire), AlN, or, as shown in FIG. 1A, SiC (silicon carbide, carborundum) such as 4H—SiC, 6H—SiC, or 3C—SiC.

Top 2DEG current channel layer 107 may be formed in a GaN channel layer 103 at an interface with an $In_yAl_zGa_{1-y-z}N$ electron supply layer 102, where $0 \leq y < 1$, $0 < z < 1$. Bottom 2DEG current channel 108 maybe formed in a GaN channel layer 105 at an interface with an $In_yAl_zGa_{1-y-z}N$ electron supply layer 104, where $0 \leq y < 1$, $0 < z < 1$. $In_yAl_zGa_{1-y-z}N$ electron supply layer 104, which is situated between GaN channel layers 103 and 105, may create a potential barrier that impedes tunneling of electrons between 2DEG current channels 107 and 108. However, depending on the mobility and velocity of electrons in the 2DEG current channels 107 and 108, as well the local distribution electric fields, electrons may be transferred across the potential barrier and between the 2DEG current channels. The GaN channel layers may optionally have a thickness of about 5 nm (nanometers) or more. The $In_yAl_zGa_{1-y-z}N$ electron supply layers may optionally have a thickness about 2 nm or more.

In certain embodiments of the invention, heterostructure 100 may further comprise a cap layer 101, which may comprise GaN. Heterostructure 100 may include other layers above, below, or between the above-specified layers, such as but not limited to buffer layers, spacer layers, and potential modifying layers, as needed and as known in the art.

FIG. 1B shows an energy band gap diagram of heterostructure 100 in the vicinity of plug 109. Regions in the graphs corresponding to semiconductor layers shown in FIG. 1A are labeled with the same numerals with which they are labeled in FIG. 1A. Horizontal dashed lines in the graphs indicate heterojunctions between the layers. Potential energy is shown along an ordinate of the graph and a line 112 indicates the Fermi energy level for the band diagram. Line 111 in the graph delineates a conduction band edge for the region of heterostructure 100 associated with the graph.

When the multichannel HEMT having heterostructure 100 is turned ON, the conduction band is lowered (shifted leftward on the graph) so that the potential wells 117 and 118 are at least partially below Fermi energy level 112. Potential wells 117 and 118 are therefore at least partially filled with electrons that populate 2DEGs in 2DEG current channels 107 and 108 (as shown in FIG. 1A), respectively.

Reference is made back to FIG. 1A. In accordance with an embodiment of the invention, plug 109 may be formed in a recess etched from heterostructure 100 that traverses 2DEG current channels 107 and 108. The contact between plug 109 and 2DEG current layers 107 and 108, according to an embodiment of the invention, may be an ohmic contact. Plug 109 optionally may be shaped substantially as cylinders, prisms or frustrums. The plug may be optionally shaped, along a surface of a heterostructure, substantially as a circle, an oval, a square, a rectangle or a bar. A width on a side, or a diameter, of plug 109 (schematically represented by the letter "W" in FIG. 1A) may optionally be between about 0.1 microns and about 5 microns. A length of plug 109 (schematically represented by the letter "L" in FIG. 1A) may optionally be between about 0.1 microns to about 10 microns. Plug 109 may optionally comprise a metal, which may optionally comprise one or more of aluminum, titanium, copper, gold, or alloys thereof.

Reference is now made to FIG. 1C, showing a cross section view of GaN-based heterostructure 100 with an alternative plug 120, in accordance with an embodiment of the invention. Plug 120 is substantially similar to plug 109, and further includes a top extension 122 that covers a top portion of heterostructure 100. The addition of top extension 122 serves to reduce the contact resistance between semiconductor layers of heterostructure 100 and plug 120.

Methods of forming metal plugs in semiconductor heterostructures are known in the art. The plug may be prepared by first creating a recess of a desired width and depth in the desired location of the heterostructure using known methods of semiconductor fabrication such as but not limited to wet etching or plasma etching, and then forming a patterned layer of metal such that the recesses are filled with the metal, thus forming the plugs. The metal may optionally be settled in self-aligned recesses. Optionally, the metal of the plug covers the entire inner surface of the recess. Methods of preparation of ohmic contacts between metals, such as the metal species specified above, and semiconductor materials, including nitride semiconductors such as GaN, are well-known in the art.

Electrically coupling 2DEG current channel in a multi-channel HEMT with plugs, in accordance with an embodiment of the invention, may reduce $R_{DS(ON)}$ of the multi-channel HEMT by, for example, providing alternative current routes for the ON current if one of the plurality of 2DEG current channels contains a disruption that prevents the disrupted 2DEG current channel from efficiently passing the ON current. Optionally, the disruption may be a physical disruption such as a trench in the heterostructure that transects a 2DEG current channel. Optionally, the disruption may be a functional disruption, for example where a 2DEG current channel has a region of disrupted channel conductivity. The disrupted channel conductivity may be due to, for example, a potential barrier created by a negative-biased Schottky contact on the hetero structure.

FIG. 2A schematically shows a multichannel HEMT 200 comprising a trench 220 formed in a portion 212 of a heterostructure 210 having a top 2DEG current channel 252 and a bottom 2DEG current channel 254, and a row of plugs 209 in accordance with an embodiment of the invention. Trench 220 transects top 2DEG current channel 252 and thus interferes with or eliminates the ability of top 2DEG current channel 252 to carry ON current between a source 222 and a drain 224. The flow of electrons participating in the ON current between source 222 and drain 224 through 2DEG current channels 252 and 254 is schematically represented by bold arrows 260. A gate 226 may optionally be formed in trench 220.

Heterostructure 210 may be substantially similar to heterostructure 100 described with reference to FIG. 1A, having top 2DEG current channel 252 and bottom 2DEG current channel 254 formed by heterojunctions between a GaN channel layer (not shown) and a $In_y Al_zGa_{1-y-z}N$ electron source layer where $0 \leq y < 1$, $0 < z < 1$ (not shown). Multichannel HEMT 200 may further comprise, above heterostructure 210, a $SiN_x$-based passivation layer 234 and a dielectric layer 230.

In accordance with an embodiment of the invention, plugs 209 are situated in a row optionally substantially evenly spaced with each other, and arranged between source 222 and trench 220 at a substantially same distance from a side of trench 220. Each of plugs 209 may be substantially similar to plug 109 described with reference to FIG. 1A. Each of plugs 209 traverses and forms an ohmic connection with transected top 2DEG current channel 252 and intact bottom 2DEG current channel 254 so that the channels are electrically coupled. Thus, as schematically indicated by bold arrow 260, electrons from a portion of top 2DEG current channel 252 that is traversed by plugs 209 may be relatively freely carried to intact bottom 2DEG current channel 254.

Under certain conditions, the portion of transected top 2DEG current channel 252 that is situated between trench 220 and drain 224, may also participate in carrying electrons from source 222 to drain 224. Typically, the electric field generated between the gate and the drain is stronger than the electric field generated between the gate and the source. The electric field created by a positive potential at gate 226 when the multichannel HEMT is ON may be sufficiently strong and have a proper direction to help electrons in bottom 2DEG current channel 254 overcome a potential barrier separating the two 2DEG current channels. Thus, electrons may transit from bottom 2DEG current channel 254 to top 2DEG current channel 252 in the vicinity of the drain side of the gate, as schematically indicated by the dotted portion of bold arrow 260.

As a result of making available additional 2DEG current channel portions to carry electrons from source 222 to drain 224, plugs 209 serve to reduce $R_{DS(ON)}$ of multichannel HEMT 200.

FIG. 2B schematically shows an alternative multichannel HEMT 300 that is substantially identical to multichannel HEMT 200 shown in FIG. 2A, with the addition of plugs 309 arranged in a row in heterostructure 210 between trench 220 and drain 224. Plugs 209 and 309 connect transected top 2DEG current channel 252 on either side of trench 220 through a short portion of intact bottom 2DEG current channel 254, so that transected top 2DEG current channel 252, together with intact bottom 2DEG current channel 254, may carry electrons from source 222 to drain 224, as schematically indicated by bold arrow 360. Thus, as a result of making available additional 2DEG current channel portions to carry electrons from source 222 to drain 224, plugs 209 and 309 serve to reduce $R_{DS(ON)}$ of multichannel HEMT 300.

FIG. 3 shows a graph comparing electrical properties measured from experimental normally OFF GaN-based multichannel HEMTs having three different arrangements of the heterostructure between the source and the gate. Lines 510, 520 and 530 display measured $R_{DS(ON)}$ from the three experimental multichannel HEMTs, respectively, as a function of drain current ($I_d$). A first multichannel HEMT corresponding to line 510 is substantially identical to multichannel HEMT 200 shown in FIG. 2A, having a top 2DEG current channel that is transected by a trench in which a gate is formed, a bottom 2DEG current channel that is intact, and plugs arranged in a row between the gate and a source that electrically couple the top and bottom 2DEG current channels. Further, the multichannel HEMT of line 510 is characterized by a gate-to-source length ($L_{GS}$) of 2× microns. A second multichannel HEMT corresponding to line 520 is substantially similar to the multichannel HEMT of line 510, but without the plugs electrically coupling the top and bottom 2DEG current channels. A third multichannel HEMT corresponding to line 530 is substantially similar to the plug-less multichannel HEMT of line 520, but with half the length between the source and the gate ($L_{GS}$=X microns).

As shown in lines 510, 520 and 530, the relationship between $R_{DS(ON)}$ and $I_d$ of a multichannel HEMT is generally characterized by a linear phase where $R_{DS(ON)}$ stays substantially constant relative to $I_d$, an exponential phase where $R_{DS(ON)}$ increases exponentially with $I_d$ and a maximum $I_d$ ($I_d$ max).

A comparison of lines 510 and 520 demonstrates that including a row of plugs to electrically couple the transected top 2DEG current channel and the intact bottom 2DEG current channel serves to both lower the $R_{DS(ON)}$ of the linear phase, as well as increase $I_d$ max. The linear phase $R_{DS(ON)}$ of line 520 corresponding to the plug-less second multichannel HEMT is about 15 Ohm*mm, while the linear phase $R_{DS(ON)}$ of the substantially identical first multichannel HEMT having plugs, corresponding to line 510, is about 12.5 Ohm*mm. Further, $I_d$ max of the plug-less second multichannel HEMT corresponding to line 520 is about 260 mA/mm (milliAmperes per millimeter), and the inclusion of plugs increases the $I_d$ max, as seen with the first multichannel HEMT corresponding to line 510 whose $I_d$ max is about 375 mA/mm.

Reducing the $L_{GS}$ is a known alternative method of reducing $R_{DS(ON)}$ and increasing $I_d$ max of FETs, including multichannel HEMTs. A comparison of lines 520 and 530 confirm that halving the $L_{GS}$ serves to both reduce $R_{DS(ON)}$ and increase $I_d$ max in the experimental multichannel HEMTs. However, a comparison of lines 510 and 530 shows that inclusion of plugs, in accordance with an embodiment of the invention, can be more effective in improving multichannel HEMT performance than shortening the $L_{GS}$. The plugged first multichannel HEMT of line 510 has an extended linear phase and a higher $I_d$ max compared to the reduced-$L_{GS}$ third multichannel HEMT of line 530.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Descriptions of embodiments of the invention in the present application are provided by way of example and are not intended to limit the scope of the invention. The described embodiments comprise different features, not all of which are required in all embodiments of the invention. Some embodiments utilize only some of the features or possible combinations of the features. Variations of embodiments of the invention that are described, and embodiments of the invention comprising different combinations of features noted in the described embodiments, will occur to persons of the art. The scope of the invention is limited only by the claims.

The invention claimed is:

1. A field effect transistor (FET) comprising:
   a plurality of substantially parallel conductive channels, a first conductive channel and a second conductive channel, separated by potential barriers; and
   an at least one electrically conducting plug that to traverse and form an ohmic connection with at least two of the plurality of conductive channels, the first conductive channel and the second conductive channel, the at least one electrically conductive plug is situated between a source and a drain of the FET to electrically couple a non-disrupted portion of the first conductive channel to a non-disrupted portion of the second conductive channel, and wherein the first conductive channel having a region of a disrupted channel conductivity, the region of the disrupted channel conductivity comprises a potential barrier created by a negative-biased Schottky contact.

2. The FET of claim 1, wherein at least one of the plurality of conductive channels comprises a two dimensional electron gas (2DEG) current channel.

3. The FET of claim 1, wherein the region of disrupted channel conductivity is created by a trench, the trench is to transect that transects at least a portion of the first conductive channel.

4. The FET of claim 3, wherein a gate of the FET is situated inside the trench.

5. The FET of claim 1, wherein the at least one electrically conductive plug is situated between the source and the region of disrupted channel conductivity.

6. The FET of claim 1, wherein the at least one electrically conductive plug is situated between the drain and the region of disrupted channel conductivity.

7. The FET of claim 1, comprising at least one electrically conductive plug between the drain and the region of disrupted channel conductivity and at least one electrically conductive plug between the source and the region of disrupted channel conductivity.

8. The FET of claim 1, wherein the at least one electrically conductive plug comprises an array of plugs.

9. The FET of claim 8, wherein electrically conductive plugs of the plug array are evenly spaced with each other.

10. The FET of claim 9, wherein the plug array comprises a row of evenly spaced plugs situated at a substantially fixed distance from a side of a trench.

11. The FET of claim 2, wherein at least one 2DEG current channel is located in a vicinity of a heterojunction interface between a narrow band gap nitride semiconductor layer and a wide band gap nitride semiconductor layer.

12. The FET of claim 11, wherein the narrow band gap semiconductor layer comprises GaN.

13. The FET of claim 12, wherein the GaN layer has a thickness of about 5 nm or more.

14. The FET of claim 11, wherein the wide band gap semiconductor layer comprises $In_yAl_zGa_{1-y-z}N$ where $0 \leq y < 1$, $0 < z < 1$.

15. The FET of claim 1, wherein the at least one electrically conducting plug has a width of between about 0.1 microns and about 5 microns.

16. The FET of claim 1, wherein the at least one electrically conducting plug has a length of between about 0.1 microns and about 10 microns.

17. The FET of claim 1, wherein the at least one electrically conducting plug comprises a metal.

18. The FET of claim 17, wherein the metal comprises one or more of a selection of the group consisting of aluminum, platinum, titanium, copper, gold and alloys thereof.

\* \* \* \* \*